United States Patent
Osterwald et al.

(10) Patent No.: US 10,818,633 B2
(45) Date of Patent: Oct. 27, 2020

(54) SINTERING TOOL FOR THE LOWER DIE OF A SINTERING DEVICE

(71) Applicant: DANFOSS SILICON POWER GMBH, Flensburg (DE)

(72) Inventors: Frank Osterwald, Kiel (DE); Ronald Eisele, Surendorf (DE); Martin Becker, Kiel (DE); Jacek Rudzki, Kiel (DE); Lars Paulsen, Hollingstedt (DE); Holger Ulrich, Eisendorf (DE)

(73) Assignee: Danfoss Silicon Power GmbH, Flensburg (DE)

( * ) Notice: Subject to any disclaimer, the term of this patent is extended or adjusted under 35 U.S.C. 154(b) by 49 days.

(21) Appl. No.: 15/514,622

(22) PCT Filed: Sep. 9, 2015

(86) PCT No.: PCT/EP2015/070621
§ 371 (c)(1),
(2) Date: Mar. 27, 2017

(87) PCT Pub. No.: WO2016/050467
PCT Pub. Date: Apr. 7, 2016

(65) Prior Publication Data
US 2017/0221852 A1    Aug. 3, 2017

(30) Foreign Application Priority Data

Sep. 29, 2014   (DE) .................. 10 2014 114 096

(51) Int. Cl.
B23K 37/00    (2006.01)
H01L 23/00    (2006.01)
(Continued)

(52) U.S. Cl.
CPC .............. H01L 24/75 (2013.01); B22F 3/003 (2013.01); B22F 3/14 (2013.01); B23K 37/0408 (2013.01);
(Continued)

(58) Field of Classification Search
CPC ........... H01L 24/75; H01L 2224/75985; H01L 2924/00014; H01L 2224/8384;
(Continued)

(56) References Cited

U.S. PATENT DOCUMENTS 2,900,287 A * 8/1959 Bestler .................... H01L 21/24
438/537
2,922,092 A * 1/1960 Gazzara .................. H01L 24/33
257/747
(Continued)

FOREIGN PATENT DOCUMENTS

CN    1462067 A    12/2003
CN    1823409 A    8/2006
(Continued)

OTHER PUBLICATIONS

C-THERM Technologies "Summary of Coefficient of Linear Expansion (CTE) of Metals" (2020).*
(Continued)

*Primary Examiner* — Kiley S Stoner
(74) *Attorney, Agent, or Firm* — McCormick, Paulding & Huber PLLC

(57) ABSTRACT

Tool (10) for the lower die of a sintering device, the tool (10) having a rest (20) for an electronic subassembly (30) comprising a circuit carrier, to be sintered, where the rest (20) is formed from a material with a coefficient of linear expansion that is close to the coefficient of expansion of the circuit carrier of the electronic subassembly (30).

18 Claims, 2 Drawing Sheets

(51) Int. Cl.
*B23K 37/04* (2006.01)
*B22F 3/00* (2006.01)
*B22F 3/14* (2006.01)

(52) U.S. Cl.
CPC .......... *B23K 37/0426* (2013.01); *H01L 24/83* (2013.01); *H01L 2224/32225* (2013.01); *H01L 2224/7598* (2013.01); *H01L 2224/75985* (2013.01); *H01L 2224/75988* (2013.01); *H01L 2224/8384* (2013.01); *H01L 2224/83203* (2013.01); *H01L 2924/00014* (2013.01)

(58) Field of Classification Search
CPC . H01L 2224/32225; H01L 2224/83203; H01L 2224/7598; H01L 2224/75988; H01L 24/83; B22F 3/003; B22F 3/14; B23K 37/04; B23K 37/0408; B23K 37/0426–0452
USPC ................................ 228/49.1, 49.4, 49.5, 6.2
See application file for complete search history.

(56) References Cited

U.S. PATENT DOCUMENTS

| | | | |
|---|---|---|---|
| 2,945,688 A | | 7/1960 | Pajenkamp et al. |
| 3,112,388 A | * | 11/1963 | Wiant .................. B23K 1/0014 219/85.17 |
| 3,480,842 A | * | 11/1969 | Scharli .................. H01L 24/33 257/742 |
| 3,501,288 A | | 3/1970 | Krainer et al. |
| 3,529,759 A | * | 9/1970 | Clark .................. B23K 20/023 228/6.2 |
| 3,896,541 A | * | 7/1975 | Golinski .............. B23K 20/002 228/180.21 |
| 4,202,690 A | | 5/1980 | Funke |
| 4,252,263 A | * | 2/1981 | Houston ............... B23K 20/023 228/193 |
| 4,257,156 A | * | 3/1981 | Houston ................. H01L 21/48 228/160 |
| 4,340,902 A | * | 7/1982 | Honda .................. H01L 23/047 174/547 |
| 4,348,339 A | | 9/1982 | Assmann |
| 4,392,153 A | * | 7/1983 | Glascock, II ......... H01L 23/051 228/193 |
| 4,591,537 A | * | 5/1986 | Aldinger ............... C04B 35/581 174/16.3 |
| 4,800,421 A | * | 1/1989 | Davis ....................... C03C 8/24 257/782 |
| 4,903,885 A | | 2/1990 | Schwarzbauer |
| 4,903,886 A | | 2/1990 | Schwarzbauer |
| 5,099,310 A | * | 3/1992 | Osada ...................... B22F 3/24 257/707 |
| 5,213,248 A | * | 5/1993 | Horton ................. B23K 20/025 228/44.7 |
| 5,247,425 A | * | 9/1993 | Takahasi ............. H01L 23/4338 165/185 |
| 5,352,629 A | | 10/1994 | Paik et al. |
| 5,396,403 A | * | 3/1995 | Patel .................... H01L 23/433 257/713 |
| 5,653,376 A | * | 8/1997 | Nakamura ........... B23K 20/025 228/44.7 |
| 6,003,757 A | * | 12/1999 | Beaumont ............ B23K 3/0623 228/246 |
| 6,108,205 A | * | 8/2000 | Bergstedt ............. H01L 23/367 174/51 |
| 6,161,748 A | | 12/2000 | Katayama et al. |
| 6,199,748 B1 | * | 3/2001 | Zhu ...................... B23K 20/023 228/121 |
| 6,390,439 B1 | * | 5/2002 | Cordes ................. B23K 3/0623 156/60 |
| 6,435,401 B1 | | 8/2002 | Miitsu et al. |
| 6,821,381 B1 | * | 11/2004 | Yamauchi ............ B23K 20/025 100/321 |
| 8,822,036 B1 | | 9/2014 | Wereszczak |
| 2001/0005053 A1 | | 6/2001 | Kitae et al. |
| 2003/0027371 A1 | | 2/2003 | Sunagawa et al. |
| 2004/0063251 A1 | * | 4/2004 | Ootsuka ................. H01L 24/75 438/119 |
| 2004/0157362 A1 | * | 8/2004 | Beroz .................. H01L 21/561 438/106 |
| 2006/0186423 A1 | * | 8/2006 | Blonder .............. H01L 25/0753 257/98 |
| 2006/0210705 A1 | | 9/2006 | Itoh et al. |
| 2006/0214291 A1 | * | 9/2006 | Sasaki .................. H01L 23/051 257/734 |
| 2006/0266792 A1 | * | 11/2006 | Ko ....................... B23K 37/047 228/6.2 |
| 2007/0131353 A1 | | 6/2007 | Gobl |
| 2008/0073776 A1 | | 3/2008 | Suh et al. |
| 2008/0156398 A1 | | 7/2008 | Yasuda et al. |
| 2009/0032570 A1 | | 2/2009 | Matsumura |
| 2009/0039507 A1 | | 2/2009 | Funaki |
| 2009/0283575 A1 | * | 11/2009 | Budd ................... B23K 1/0016 228/246 |
| 2009/0302485 A1 | * | 12/2009 | Fan ........................ H01L 23/13 257/780 |
| 2009/0325116 A1 | | 12/2009 | Matsuura et al. |
| 2010/0051319 A1 | | 3/2010 | Schmitt et al. |
| 2010/0055828 A1 | | 3/2010 | Schmitt et al. |
| 2010/0093131 A1 | | 4/2010 | Maeda |
| 2010/0224674 A1 | * | 9/2010 | Liu ........................ B22F 7/062 228/212 |
| 2011/0114708 A1 | | 5/2011 | Maeda et al. |
| 2011/0259876 A1 | | 10/2011 | Breznak |
| 2011/0290863 A1 | | 12/2011 | Kajiwara et al. |
| 2012/0037688 A1 | | 2/2012 | Kock et al. |
| 2012/0052402 A1 | | 3/2012 | Turek et al. |
| 2012/0153011 A1 | | 6/2012 | Schäfer et al. |
| 2012/0247664 A1 | * | 10/2012 | Kobayashi .............. H01L 24/75 156/285 |
| 2013/0092310 A1 | | 4/2013 | Ishigami et al. |
| 2013/0250538 A1 | | 9/2013 | Le et al. |
| 2013/0271248 A1 | | 10/2013 | Nagata et al. |
| 2015/0037197 A1 | | 2/2015 | Komatsu |
| 2015/0077895 A1 | * | 3/2015 | Jindo .................... F28F 21/086 361/234 |
| 2015/0090768 A1 | | 4/2015 | Kuroda et al. |
| 2016/0059361 A1 | | 3/2016 | Schäfer et al. |
| 2016/0190046 A1 | | 6/2016 | Fontana |
| 2017/0141074 A1 | | 5/2017 | Schäfer et al. |
| 2017/0216920 A1 | | 8/2017 | Osterwald et al. |
| 2017/0229418 A1 | | 8/2017 | Osterwald et al. |
| 2017/0229424 A1 | | 8/2017 | Eisele et al. |
| 2017/0326640 A1 | | 11/2017 | Schmitt et al. |
| 2018/0236672 A1 | | 8/2018 | Scotchmer |

FOREIGN PATENT DOCUMENTS

| | | |
|---|---|---|
| CN | 101111932 A | 1/2008 |
| CN | 101371346 A | 2/2009 |
| CN | 101490831 A | 7/2009 |
| CN | 102709203 A | 10/2012 |
| CN | 103081088 A | 5/2013 |
| CN | 102569110 B | 6/2014 |
| DE | 102007047698 A1 | 4/2008 |
| DE | 10 2008 009 510 B3 | 7/2009 |
| DE | 102008048869 A1 | 4/2010 |
| DE | 10 2010 020 696 A1 | 11/2011 |
| DE | 10 2010 020 696 B4 | 11/2012 |
| DE | 10 2013 003 527 A1 | 9/2014 |
| EP | 2 278 032 A2 | 1/2011 |
| GB | 496763 | 12/1938 |
| GB | 558382 | 1/1944 |
| GB | 1459475 | 12/1976 |
| JP | S53118202 | 10/1978 |
| JP | -01005026 A * | 1/1989 |
| JP | 2003-347360 A | 12/2003 |
| JP | 2004-296746 A | 10/2004 |
| JP | 2006-352080 A | 12/2006 |
| KR | 2012-0090202 A | 8/2012 |
| WO | 2008125726 A1 | 10/2008 |

(56) References Cited

FOREIGN PATENT DOCUMENTS

| WO | 2014/003107 A1 | 1/2014 |
| WO | 2014/129626 A1 | 8/2014 |
| WO | 2014/135151 A2 | 9/2014 |

OTHER PUBLICATIONS

International Search Report for Serial No. PCT/EP2015/070617 dated Dec. 21, 2015.
International Search Report for Serial No. PCT/EP2015/070625 dated Dec. 21, 2015.
International Search Report for Serial No. PCT/EP2015/071613 dated Feb. 26, 2016.
"Die Niedertemperatur-Verbindungstechnik der Leistungselektronik" by Christian Mertens (Jan. 1, 2004), Book series: Fortschritt-Berichte VD1, Reihe 21, Elektrotechnik, No. 365, VDI Verlag, Düsseldorf, Germany, pp. 1-35, 72-101, 116-141; and English translation of pertinent parts thereof.
"Reduction of Thermomechanical Stress by Applying a Low Temperature Joining Technique" by S. Klaka et al, Proceedings of the International Symposium on Power Semiconductor Devices (May 31-Jun. 2, 1994), Davos, Switzerland, pp. 259-264.
International Search Report for PCT Serial No. PCT/EP2015/070621 dated Dec. 15, 2015.

\* cited by examiner

SINTERING TOOL FOR THE LOWER DIE OF A SINTERING DEVICE

CROSS-REFERENCE TO RELATED APPLICATIONS

This application is a National Stage application of International Patent Application No. PCT/EP2015/070621, filed on Sep. 9, 2015, which claims priority to German Patent Application No. 102014114096.6, filed on Sep. 29, 2014, each of which is hereby incorporated by reference in its entirety.

TECHNICAL FIELD

The invention relates to a tool for the lower die of a sintering device, the tool having a rest for an electronic subassembly to be sintered.

BACKGROUND

Sintering devices for carrying out the low-temperature pressure sintering of electronic subassemblies are already known. These have, for example, a sintering chamber which can be filled with a gas that is particularly conducive to the sintering operation or a corresponding gas mixture, and have an upper die and a lower die arranged in the sintering chamber, it being possible for the upper die and the lower die to be moved towards one another and preferably to have in each case a heating device of their own.

The lower die and/or the upper die often have to be specially shaped for carrying out specific processes or for adaptation to the products to be sintered, and so tools that can be fastened to the lower die or the upper die and allow easy modification of the device as a whole are usually provided.

For example, a sintering device for sintering an electronic subassembly comprising a circuit carrier is formed in such a way that a lower die is provided with a massive tool which carries and heats the planar circuit carrier. A temperature-resistant elastic medium of the upper die tool, in the form of a pressure pad, produces an increasing pressure on the surface of the circuit carrier, whereby the latter is pressed onto the planar support of the lower die tool. The flexible medium of the pressure pad provides a quasi-hydrostatic pressure not only on the components to be joined of the electronic subassembly but also on all of the surfaces of the lower die tool. A massive lower tool therefore forms a counter bearing in the quasi-hydrostatic sintering process, onto which the circuit carrier is pressed with compressive engagement by the elastic medium. The thermal energy is also supplied to the circuit carrier by way of this metallic compressive engagement.

However, a disadvantage of this design is that, at the temperature prevailing during the sintering operation of up to 350° C., stress cracks occur in ceramic materials which form part of the electronic subassembly, on account of the different coefficients of expansion of the ceramic material of the electronic subassembly and the lower die, which may, for example, comprise high-grade steel.

SUMMARY

The object of the invention is therefore to provide a tool for a sintering device with which cracks and fractures of the ceramic material that occur during the sintering operation are avoided.

This object is achieved according to the invention by the tool for a sintering device comprising a tool for the lower die of a sintering device, the tool having a rest for an electronic subassembly comprising a circuit carrier, to be sintered, where the rest is formed from a material with a coefficient of linear expansion that is close to the coefficient of expansion of the circuit carrier of the electronic subassembly. The subclaims provide advantageous designs of the invention.

The basic concept of the invention is to provide a rest for the electronic subassembly, which rest has a low coefficient of linear expansion, and one that is similar to that of the electronic subassembly as a whole or the circuit carrier thereof. Such a coefficient of linear expansion may be approximately $11 \cdot 10^{-6} K^{-1}$. This results in no displacements, or only very minor displacements, between the electronic subassembly and the rest during temperature changes.

Since such low-expansion materials, that is to say materials having a low coefficient of thermal expansion, such as molybdenum or Kovar, are very cost-intensive to procure and are very difficult to machine, on account of the properties of the material, recourse is made to the designs claimed, which makes easy and work-friendly production of the tool possible.

According to the invention, therefore, a tool for the lower die of a sintering device is provided, the tool having or forming a rest for an electronic component to be sintered and the rest being formed from a material with a coefficient of linear expansion (measured at 20° C.) of less than or equal to $11 \cdot 10^{-6} K^{-1}$.

The material preferably has a coefficient of linear expansion (measured at 20° C.) of less than or equal to $6 \cdot 10^{-6} K^{-1}$.

In particular, the rest may be formed by coating at least a partial region of the tool by means of a thermal spraying method, in particular by cold gas spraying.

Alternatively, the rest may be formed as a plate, the tool having a depression receiving the rest formed as a plate. In this case, the depression has a channel in the wall or on the bottom of the depression leading to outside the tool, in order that no air or gas is trapped in the depression when the sintering operation is being carried out and a pressure equalization can take place between the depression and the atmosphere surrounding the die tools.

In order to ensure an effective heat transfer with the electronic subassembly to be sintered, the plates serving as a rest should be designed to be as thin as possible.

The surface of the plates serving as a rest may preferably be coated with the material. Alternatively, however, the plate is formed solidly from the material.

The material used is preferably molybdenum or an alloy comprising molybdenum. Other substances with a likewise low coefficient of expansion, for example the material known by the trade name Kovar, are likewise conceivable.

Furthermore, for carrying out batch processing, it is preferably provided that the tool has a plurality of rests, each for receiving an electronic subassembly to be sintered.

Finally, a sintering device in which the lower die as a whole is formed as the tool described above is also provided according to the invention.

BRIEF DESCRIPTION OF THE DRAWINGS

The invention is explained in more detail on the basis of an exemplary embodiment that is represented in the appended figures. In these figures.

DETAILED DESCRIPTION

Figure 1:
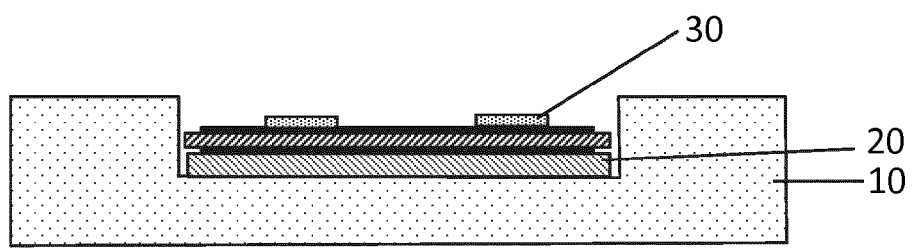
FIG. 1 shows a sectional view through a first exemplary embodiment according to the invention of a particularly preferable design.

FIG. 1 shows a tool 10, which has a depression, in which a rest 20 formed as a plate and an electronic subassembly 30 to be sintered arranged thereupon are represented. The depression in the tool 10 is designed such that the rest 20 and the subassembly 30 are received completely by the depression and the surface of the subassembly 30 finishes flush with the surface of the tool 10. It may be provided in this case that the rest 20 is stocked in various thicknesses, in order to compensate for differing heights of the subassembly 30.

Figure 2:
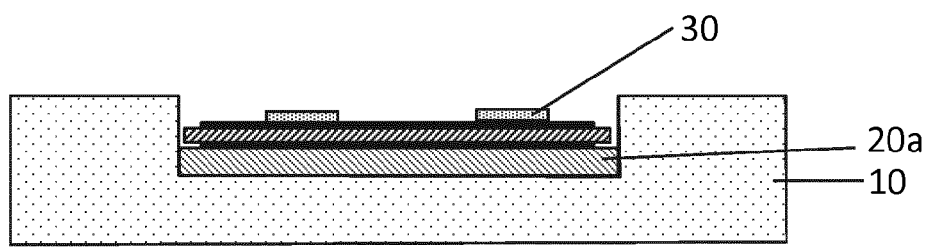
FIG. 2 shows a sectional view through a second exemplary embodiment according to the invention of a particularly preferable design.

FIG. 2 shows a tool 10, which has a depression, in which a partial coating 20a formed as a layer at the bottom of the depression and an electronic subassembly 30 to be sintered arranged thereupon are represented. The depression in the tool 10 is designed such that the partial coating 20a and the subassembly 30 are received completely by the depression and the surface of the subassembly 30 finishes flush with the surface of the tool 10. It may be provided in this case that the partial coating 20a is varied in thickness, in order to compensate for differing heights of the subassembly 30.

Figure 3:
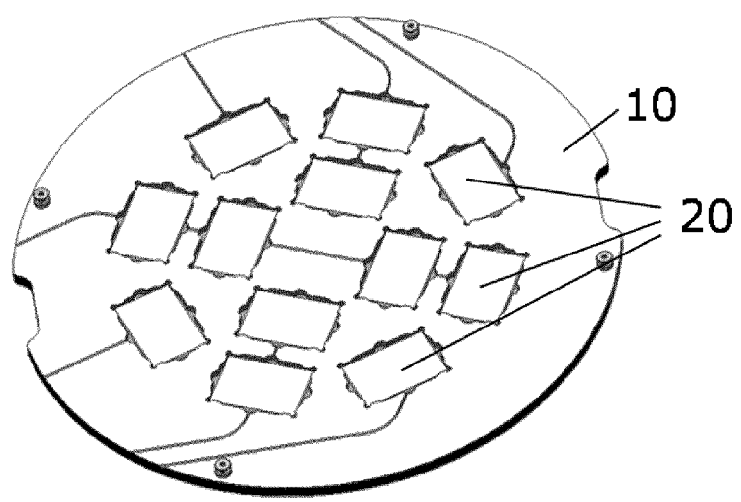
FIG. 3 shows a perspective view of a third exemplary embodiment according to the invention of a particularly preferable design.

FIG. 3 shows a tool 10, which has a number of depressions, in which a plurality of rests 20 formed either as a plate or a layer at the bottom of the depression. The depressions in the tool 10 are designed such that there are channels leading to the periphery of the tool 10.

In all of the embodiments illustrated, if the tool 10 is at the same time the die of a sintering device, it preferably comprises a heating element (not shown).

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A lower die of a sintering device, the lower die comprising a tool, the tool having a rest for an electronic subassembly comprising a circuit carrier, to be sintered, where the rest is formed from a material with a coefficient of linear expansion measured at 20° C. of less than or equal to $15 \cdot 10^{-6} K^{-1}$, wherein the tool has a depression and the rest is located within the depression, wherein the rest is configured to receive the electronic subassembly to be sintered thereupon, wherein the rest is not a component of the electronic subassembly to be sintered, and wherein a top surface of the rest is located below a top surface of the tool.

2. The lower die according to claim 1, wherein the rest is formed from a material with a coefficient of linear expansion measured at 20° C. of less than or equal to $11 \cdot 10^{-6} K^{-1}$.

3. The lower die according to claim 1, wherein the rest is formed by coating at least a partial region of the tool.

4. The lower die according to claim 1, wherein the rest is formed as a plate.

5. The lower die according to claim 4, wherein a surface of the plate serving as a rest is coated with the material.

6. The lower die according to claim 4, wherein the plate is formed solidly from the material.

7. The lower die according to claim 1, wherein the depression has a channel in the wall or on the bottom of the depression leading to outside the tool.

8. The lower die according to claim 1, wherein the material is molybdenum or an alloy comprising molybdenum.

9. The lower die according to claim 1, wherein the tool comprises a plurality of rests.

10. A sintering device comprising the lower die according to claim 1.

11. The lower die according to claim 2, wherein the material is molybdenum or an alloy comprising molybdenum.

12. The lower die according to claim 3, wherein the material is molybdenum or an alloy comprising molybdenum.

13. The lower die according to claim 4, wherein the material is molybdenum or an alloy comprising molybdenum.

14. The lower die according to claim 5, wherein the material is molybdenum or an alloy comprising molybdenum.

15. The lower die according to claim 6, wherein the material is molybdenum or an alloy comprising molybdenum.

16. The lower die according to claim 7, wherein the material is molybdenum or an alloy comprising molybdenum.

17. The lower die according to claim 1, wherein the rest of the tool has a surface configured to removably receive the electronic subassembly.

18. The lower die according to claim 1, wherein the tool comprises a plurality of depressions and a plurality of rests, each of the plurality of rests located within one of the plurality of depressions.

* * * * *